United States Patent [19]

Myer

[11] 4,087,715

[45] May 2, 1978

[54] PIEZOELECTRIC ELECTROMECHANICAL MICROPOSITIONER

[75] Inventor: Jon H. Myer, Los Angeles, Calif.

[73] Assignee: Hughes Aircraft Company, Culver City, Calif.

[21] Appl. No.: 742,926

[22] Filed: Nov. 18, 1976

[51] Int. Cl.² ............................................. H01L 41/04
[52] U.S. Cl. .................................... 310/317; 310/328; 310/369
[58] Field of Search ............. 310/8, 8.1, 8.2, 8.3, 310/8.5, 8.6, 8.7, 9.1, 9.4, 9.8, 9.6, 9.5, 26, 317, 328, 366, 369

[56] References Cited

U.S. PATENT DOCUMENTS

| 2,439,499 | 4/1948 | Williams et al. ............... 310/9.8 UX |
| 2,596,494 | 5/1952 | Lynch ............................... 310/9.8 X |
| 3,138,749 | 6/1964 | Stibitz .............................. 310/26 X |
| 3,377,439 | 4/1968 | Rouy ................................ 310/9.6 X |
| 3,377,489 | 4/1968 | Brisbane .......................... 310/8.3 |
| 3,978,353 | 8/1976 | Kinoshita ......................... 310/9.8 X |

*Primary Examiner*—Mark O. Budd
*Attorney, Agent, or Firm*—Martin E. Gerry; W. H. MacAllister

[57] ABSTRACT

An electromechanical micropositioner for making minute angular and linear translational displacements of an element attached to same. The micropositioner employs electrical control potentiometers, a power source, and a signal source that provides for the type of displacement desired.

19 Claims, 4 Drawing Figures

PIEZOELECTRIC ELECTROMECHANICAL MICROPOSITIONER

BACKGROUND OF THE INVENTION

This invention relates to electromechanical micropositioners and particularly to micropositioners for optical applications.

Micropositioners of the prior art employ piezoelectric or magnetostrictive driver elements to provide the necessary force to move optical elements. The desired displacement is usually obtained by the combined effects of suitably energized discrete X, Y and Z coordinate drivers. The inherent disadvantages of prior art micropositioners include, a need for complex precision structures to support these discrete elements in close tolerance mutual relationships, need for special power supplies to provide smooth transition from positive to negative displacements, and need for special electrical circuitry to inject superimposed modulated signals.

SUMMARY OF THE INVENTION

It is therefore an object of the invention to provide a simple monolithic structure so as to make possible the necessary displacements as well as to reduce structural complexity.

It is another object of this invention to eliminate the need for special power supplies and to obtain displacements by use of a simple power source.

It is yet a further object to enable injection of superimposed modulation signals directly into the electrical circuitry of the control elements of the micropositioner.

Yet another object of this invention is to provide a simplified method of displacement control by means of only two adjustments.

According to the invention, an electromechanical micropositioner is provided having a piezoelectric member, electrically conductive coatings on surfaces of said member, and electrical control components connected to said coatings. A signal source is electrically connected to at least some of the coatings, and a power source is electrically connected to the control components. The piezoelectric member is generally of tubular structure having said coatings on its inner and outer surfaces. The coatings on said outer surface comprise three arc-shaped films electrically insulated from each other and regularly disposed about said outer surface, and a single coating circumjacent said outer surface and electrically insulated from said three arc-shaped coatings. The coating on said inner surface is a single endless coating.

The electrical components comprise first and second potentiometers. The first potentiometer is an endless potentiometer having 360° adjustment capability and electrically tapped at 120° intervals for making electrical connection to said three arc-shaped external coatings, the second potentiometer being electrically connected to the first potentiometer. A power source is electrically connected to the first potentiometer and to the single endless coating on said inner surface.

It should be noted that one of the electrically conductive coatings is an endless cylinder on the inner surface of said member and another of said coatings is an endless cylinder on part of the outer surface of said member and the linear displacement signal source is electrically connected between the outer endless coating and ground. Alternately a signal source may be electrically connected intermediate the endless cylindrical coating on the outer surface and ground. The signal source may be one to provide a DC voltage output, a step function voltage output, an alternating current waveform output, a sinusoidal alternating current waveform, a rectangular waveform, a triangular waveform, or a saw-tooth waveform.

Micropositioners of this type may also be used in conjunction with the system shown in U.S. patent application Ser. No. 482,188 filed June 24, 1974, now U.S. Pat. No. 4,016,415.

DETAILED DESCRIPTION

Figures 1, 2:
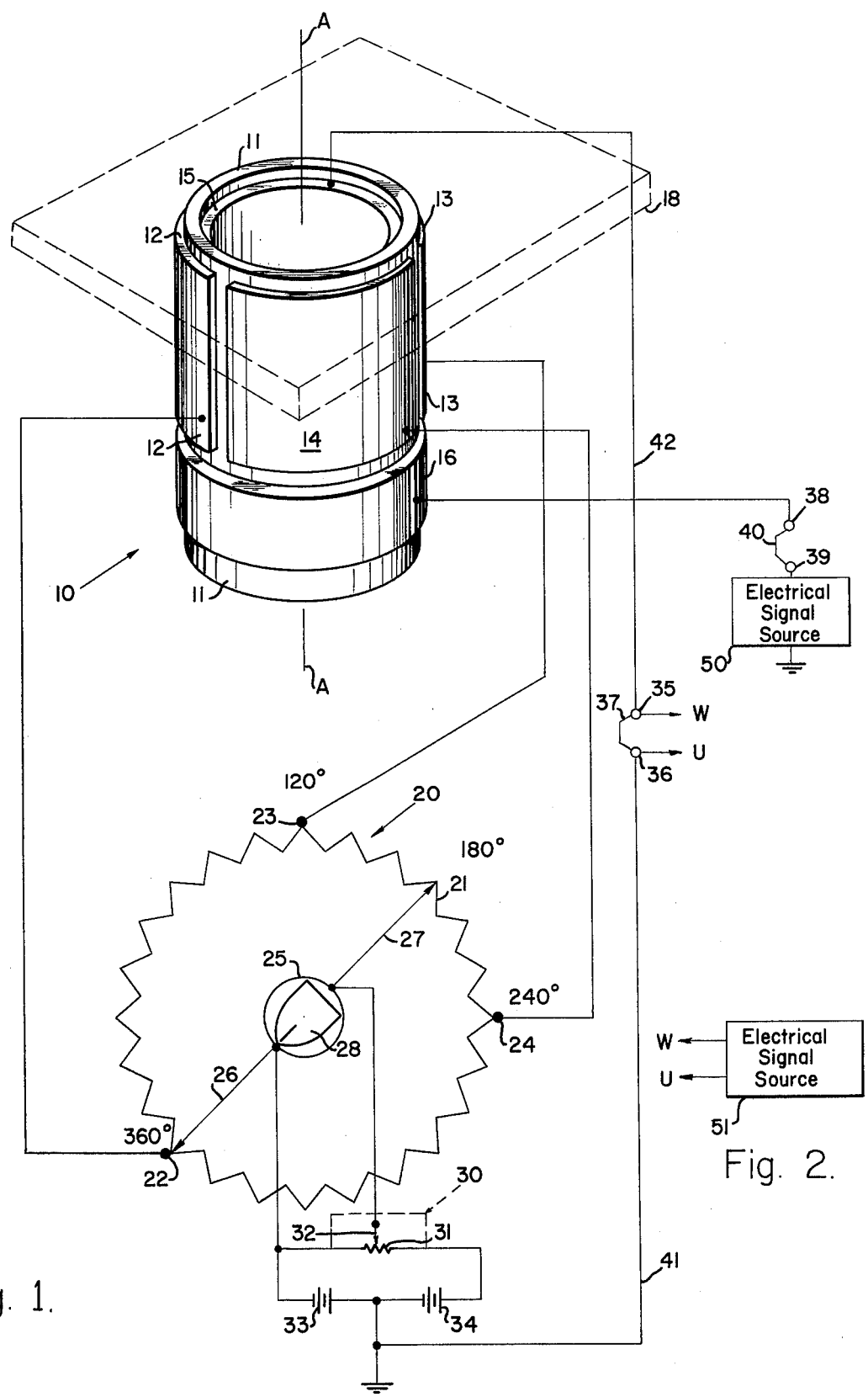
FIG. 1 is an electromagnetic schematic partially in perspective showing the component relationships in the invention.
FIG. 2 is a block diagram of an alternate signal source capable of being connected within the system of FIG. 1 in lieu of the signal source therein.

Referring to FIGS. 1 and 2, an electromechanical micropositioner is provided at 10.

Positioner 10 comprises a tubular piezoelectric member 11 which may be a transducer tube of piezoelectric material such as barium titanate, lead zirconate titanate, or lead metaniobate.

Member 11 has electrically conductive coatings 12, 13 and 14 attached to its outer surface which coatings are equally spaced circumjacent cylinder 11 and electrically insulated from each other. Member 11 may also have an endless electrical coating 15 circumjacent to and attached to its inner surface and electrically insulated from coatings 12, 13 and 14, as well as having an endless coating 16 on its outer surface electrically insulated and spaced from coatings 12, 13, 14 and 15.

Electrical control components are provided at 20, 30, 33, 34, 50 and 51 connected to the above-mentioned coatings in specific manner to be hereinbelow described.

A first potentiometer provided at 20 is endless as to its winding 21 making possible a 360° rotation of its oppositely disposed and electrically insulated arms 26 and 27, so that this potentiometer may provide a moving electrical connection at 180° displacement points on resistive winding 21 at all times. Arms 26 and 27 are each attached to electrically insulating member 25, member 25 having commutation rings thereon (not shown) so that electrical connection can be made to arms 26 and 27 while such arms are being positioned. Knob 28 is attached to member 25 and is provided as an indicator of position of arms 26 and 27 and to facilitate angular rotation of such arms.

Winding 21 is electrically tapped at 22 which is the zero or 360° point, at 23 which is the 120° point, and at 24 which is the 240° point.

Accordingly, point 22 is electrically connected to coating 12, point 23 is electrically connected to coating 13 and point 24 is electrically connected to coating 14.

An ordinary potentiometer at 30 has its movable arm 32 electrically connected to arm 27 of potentiometer 20. Winding 31 of potentiometer 30 is electrically connected across the terminals of the series-connected batteries 33 and 34. The negative side of the battery 33 being electrically connected to arm 26 of potentiometer 20.

The center tap of series-connected batteries 33-34 is electrically connected by means of wire portions 41 and 42 to inner coating 15 thus providing a positive potential to the inner coating according to the potential at the positive terminal of battery 33. The junction point of batteries 33 and 34 are at ground potential, the ground acting as a signal return. The center tap of the battery is provided to assure balanced bipolar excursion of piezoelectric member 11 irrespective of the position of potentiometer arms 26 and 27 of potentiometer 20, or arm 32 of potentiometer 30. Therefore batteries 33 and 34 will necessarily have the same voltage outputs.

An electrical signal source is provided at 50, the high side of which is electrically connected to coating 16. The return electrical path for signal source 50 is shown as ground, and therefore a voltage from source 50 will be injected into the micropositioner between coating 16 and ground.

Alternatively, an electrical signal source as at 51 may be used in lieu of source 50. When such source is used jumper wire 37 provided between terminals 35 and 36 in wire members 41-42 is removed and signal source 51 is electrically connected across terminals 35 and 36 by connecting the W terminal of source 51 to terminal 35 and the U terminal of source 51 to terminal 36. When source 51 is used, source 50 will have to be disconnected. Disconnecting such source is accomplished by removing jumper wire 40 from terminals 38 and 39. In the above description, the battery polarities may be reversed without affecting performance.

In operation the magnitude of the degree of tilt of mirror 18 attached to one end of member 11 is selected by adjustment of potentiometer 30 while the angular direction of the tilt is determined by position of oppositely disposed arms 26 and 27 of potentiometer 20.

It should be noted that the electrical signal sources 50 or 51 may be designed to provide but not limited to signals of DC character, step function character, alternating current waveforms of various types including but not limited to sinusoidal, saw-tooth, triangular, rectangular which can be combined to provide spiral scan or conical patterns.

It is also apparent that patterns such as linear sweeps passing diametrically through the boresight axis A—A may be used. This axis coincides with the optical axis and is normal to either end of the tubular piezoelectric member 11 when no signal is applied to any of its conductive layers, or normal to mirror 18 that may be mounted thereon. To obtain such a diametrical linear sweep an alternating power source would be substituted for batteries 33-34. To encode this sweep the frequency of the alternating power source can be changed synchronously with the angle setting of endless potentiometer 20.

To provide a conical sweep, or a conical spiral sweep that is a circular sweep of changing radius around the boresight axis, three variable frequency oscillators with identically variable amplitude signal output are locked to run synchronously, at a 120° phase difference. Their output is applied to the three electrodes 12, 13 and 14 of the piezoelectric driver element 11. In this configuration the selected common frequency will determine the conical scanning rate while the selected common amplitude will determine beam deviation from the boresight axis. This sweep can be encoded by tying together the rotational sweep rate with the off axis deviation signal.

Some appreciation of the system may be had by examining what happens to the piezoelectric member 11 when source 50 or 51 provides as input across its wall a single DC voltage. Thus, when outside coatings 12, 13 and 14 have a particular common potential compared with inner coating 15, if the material of member 11 is pre-polarized during its manufacture by application of a high voltage during heat treatment thereof, then the diameter of cylinder 11 increases and its length decreases. Conversely, when such outside coatings have their potential difference reversed, the diameter decreases and the length increases.

Experiments with a prototype model have shown that a laser beam can be scanned to any angular position within a one-half milliradian cone when a 600 volt battery supply is used. At the same time, a superimposed linear displacement signal along axis A—A generated by a 150 volt peak-to-peak AC signal did not affect the angular α displacement (FIG. 4 shown by planes 68 and 68″) of the micropositioner in any way. The linear displacement (FIG. 3 shown by planes 68 and 68′) can serve to provide focusing, phase adjustment or dithering functions for providing modulation.

It should be understood that the physical location of the coatings may be exchanged and that coating 15 may be disposed over the outer surface of member 11 in which case coatings 12, 13, 14 and 16 can be disposed over the inner surface of member 11.

Figure 3:
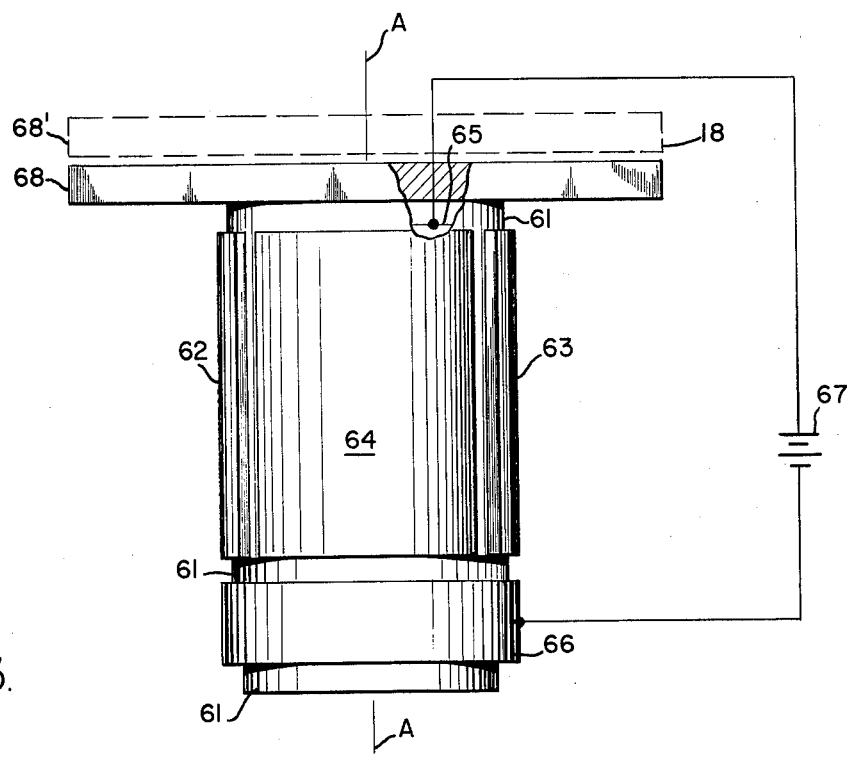
FIG. 3 is a functional schematic showing linear displacement action of the micropositioner.
Figure 4:
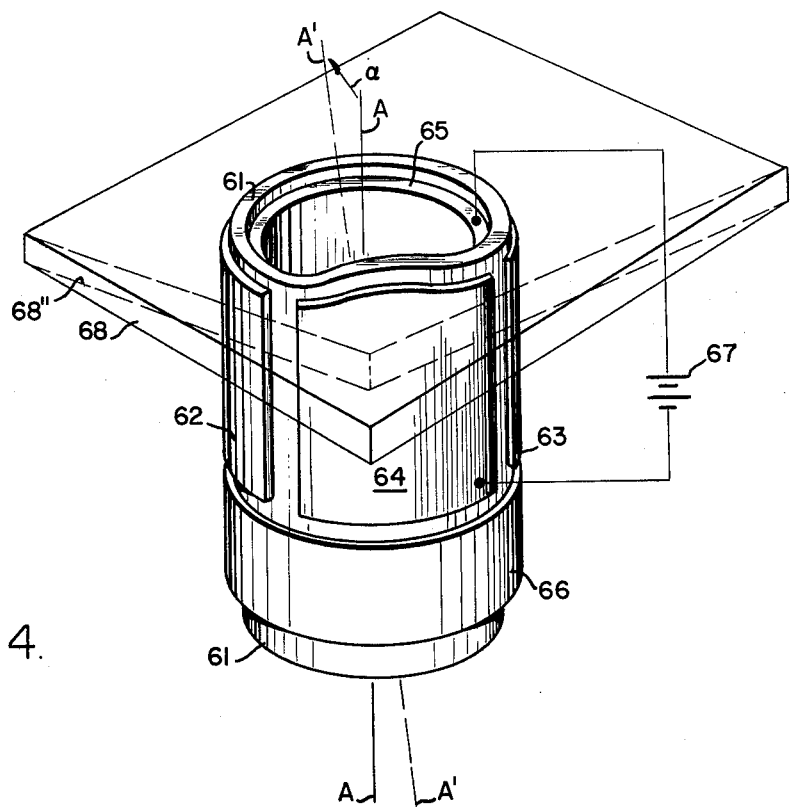
FIG. 4 is a perspective functional schematic showing angular displacement action of the micropositioner.

A better appreciation of the operation of the micropositioner may be had by reference to FIGS. 3 and 4.

Therein the transducing member analogous to 11 of FIG. 1 is shown at 61, the three arc-shaped coatings analogous to coatings 12, 13 and 14 are shown at 62, 63 and 64, respectively, the inner conductive coating analogous to coating 15 is shown at 65, the outer coating analogous to coating 16 is shown at 66, and the reflector analogous to reflector 18 is shown at 68.

In FIG. 3, battery 67 is connected between coatings 65 and 66. In FIG. 4, battery 67 is connected between coatings 64 and 65. In both these figures as well as FIG. 1, axis A—A is the same.

Accordingly, by reference to FIG. 3 with voltage applied by battery 67 to coatings 65 and 66, member 61 is elongated and hence reflector 68 attached to its end is translated to position 68′.

With reference to FIG. 4 with voltage applied by battery 67 to coatings 64 and 65, a portion of member 61 is deformed from its circular form at coating 64 area. Such deformation causes reflector 68, attached to end of member 61, to be tilted as shown to position 68″. Imaginary plane 68″ has an axis A′—A′ normal to it, so that the angle of tilt of member 68 may be described by angle formed between axis A—A and axis A′—A′.

It can therefore be seen that when voltages are applied sequentially to coatings 62, 63 and 64 with reference to coating 65, that a circular pattern will be described due to sequential deformation of portions of member 61.

What is claimed is:

1. An electromechanical micropositioner, comprising the combination;

a tubular piezoelectric member;

a plurality of arc-shaped electrically conductive coatings disposed on a first surface of the member electrically insulated from each other and a first endless electrically conductive coating disposed on a second surface opposite from the first surface of the member;

a second endless electrically conductive coating disposed over a portion of said first surface; and a first potentiometer having an endless winding with taps at regular intervals, equal in number and connected to the plurality of arc-shaped coatings, one tap per arc-shaped coating.

2. The invention as stated in claim 1, including a second potentiometer connected to said first potentiometer.

3. The invention as stated in claim 1, including a signal source electrically connected to at least some of the coatings.

4. The invention as stated in claim 2, including a power source electrically connected to the first potentiometer.

5. The invention as stated in claim 1, wherein the piezoelectric member has some of said coatings on said second surface and some of said coatings on said first surface.

6. The invention as stated in claim 5, wherein the coatings on said first surface comprise three arc-shaped coatings electrically insulated from each other and regularly disposed about said first surface, and a single coating circumjacent a portion of said first surface and electrically insulated from said three arc-shaped coatings.

7. The invention as stated in claim 5, wherein the coating on said second surface is a single endless cylindrical coating.

8. The invention as stated in claim 2, wherein the electrical components comprise first and second potentiometers.

9. The invention as stated in claim 2, wherein the first potentiometer has a 360° adjustment capability and electrically tapped at 120° intervals.

10. The invention as stated in claim 2, including a power source electrically connected to the second potentiometer and to the single endless cylindrical coating on said second surface.

11. The invention as stated in claim 3, wherein one of the electrically conductive coatings is an endless cylinder on the second surface of said member and wherein the signal source is electrically connected to the endless cylinder on said second surface.

12. The invention as stated in claim 10, including a signal source electrically intermediate the endless cylindrical coating on the second surface and the power source.

13. The invention as stated in claim 3, wherein the signal source provides a DC voltage output.

14. The invention as stated in claim 3, wherein the signal source provides a step function voltage output.

15. The invention as stated in claim 3, wherein the signal source power provides an alternating current waveform output.

16. The invention as stated in claim 15, wherein the alternating current waveform is sinusoidal.

17. The invention as stated in claim 15, wherein the alternating current waveform is rectangular.

18. The invention as stated in claim 15, wherein the alternating current waveform is triangular.

19. The invention as stated in claim 15, wherein the alternating current waveform is of saw-tooth shape.

* * * * *

UNITED STATES PATENT AND TRADEMARK OFFICE
CERTIFICATE OF CORRECTION

PATENT NO. : 4,087,715
DATED : May 2, 1978
INVENTOR(S) : Jon H. Myer

It is certified that error appears in the above—identified patent and that said Letters Patent are hereby corrected as shown below:

Delete claim 8 in its entirety.

On the cover sheet, after the Abstract, "19 Claims" should read --18 Claims--

Signed and Sealed this

Nineteenth Day of September 1978

[SEAL]

Attest:

RUTH C. MASON
*Attesting Officer*

DONALD W. BANNER
*Commissioner of Patents and Trademarks*